US012575173B2

(12) United States Patent
Chandranaika et al.

(10) Patent No.: US 12,575,173 B2
(45) Date of Patent: Mar. 10, 2026

(54) INTEGRATED CIRCUIT CELL WITH DUAL ROW, BACK-TO-BACK, TRANSISTOR BODY TIES

(71) Applicant: QUALCOMM Incorporated, San Diego, CA (US)

(72) Inventors: Manjanaika Chandranaika, Bangalore (IN); Parissa Najdesamii, San Diego, CA (US); Kamesh Medisetti, Bangalore (IN); Iranagouda Shivanagouda Naganagoudra, Bengaluru (IN)

(73) Assignee: QUALCOMM INCORPORATED, San Diego, CA (US)

( * ) Notice: Subject to any disclaimer, the term of this patent is extended or adjusted under 35 U.S.C. 154(b) by 817 days.

(21) Appl. No.: 17/878,825

(22) Filed: Aug. 1, 2022

(65) Prior Publication Data

US 2024/0038760 A1 Feb. 1, 2024

(51) Int. Cl.
| | |
|---|---|
| *H10D 84/85* | (2025.01) |
| *H01L 23/528* | (2006.01) |
| *H04B 1/40* | (2015.01) |

(52) U.S. Cl.
CPC ......... *H10D 84/85* (2025.01); *H01L 23/5286* (2013.01); *H04B 1/40* (2013.01)

(58) Field of Classification Search
CPC ...... H10D 84/85; H10D 84/981; H10D 89/10; H10D 84/0186; H10D 84/038; H01L 23/5286; H04B 1/40
USPC ....................................................... 257/369
See application file for complete search history.

(56) References Cited

U.S. PATENT DOCUMENTS

| | | | | |
|---|---|---|---|---|
| 10,157,987 B1 * | 12/2018 | Liaw | ................... | H01L 23/5226 |
| 2002/0105049 A1 | 8/2002 | Barney et al. | | |
| 2004/0159858 A1 * | 8/2004 | Chun | ................. | H03K 19/0016 |
| | | | | 257/202 |
| 2004/0188776 A1 * | 9/2004 | Russ | ...................... | H10D 30/60 |
| | | | | 257/401 |
| 2011/0049575 A1 | 3/2011 | Tanaka | | |
| 2018/0130803 A1 * | 5/2018 | Cacho | .................. | H10D 62/371 |
| 2018/0151559 A1 | 5/2018 | Sio et al. | | |
| 2018/0190640 A1 * | 7/2018 | Shimbo | .................. | H10D 89/10 |
| 2020/0019666 A1 | 1/2020 | Lai et al. | | |
| 2020/0411500 A1 * | 12/2020 | Holland | ................... | H10D 1/66 |
| 2022/0037365 A1 | 2/2022 | Huang et al. | | |
| 2023/0290785 A1 * | 9/2023 | Hino | ...................... | H10D 89/10 |

FOREIGN PATENT DOCUMENTS

| | | | | |
|---|---|---|---|---|
| CN | 114373751 A | * | 4/2022 | ........... H10D 84/834 |
| TW | M624049 U | * | 3/2022 | |

OTHER PUBLICATIONS

International Search Report and Written Opinion—PCT/US2023/068587—ISA/EPO—Oct. 10, 2023.

* cited by examiner

*Primary Examiner* — Mohammad M Hoque
(74) *Attorney, Agent, or Firm* — Loza & Loza, LLP

(57) ABSTRACT

An integrated circuit (IC), including a first row of cells including a first set of one or more complementary metal oxide semiconductor (CMOS) signal processing cells including a first diffusion region; a second row of cells including a second set of one or more CMOS signal processing cells including a second diffusion region; and a first body tie electrically coupling a first voltage rail to the first and second diffusion regions.

20 Claims, 6 Drawing Sheets

500

700

710

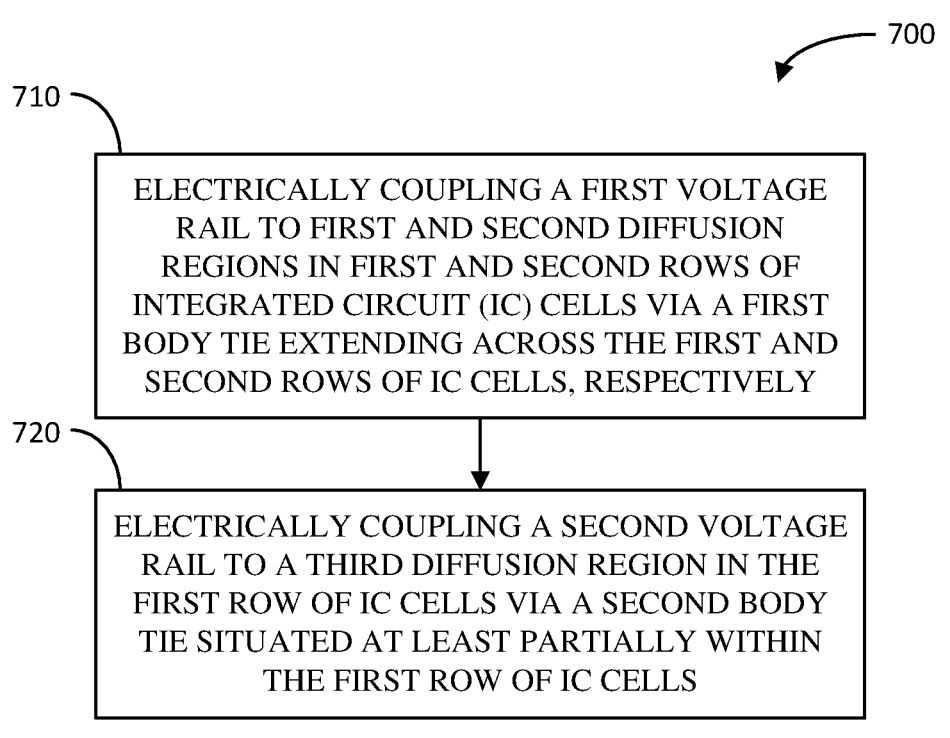

ELECTRICALLY COUPLING A FIRST VOLTAGE RAIL TO FIRST AND SECOND DIFFUSION REGIONS IN FIRST AND SECOND ROWS OF INTEGRATED CIRCUIT (IC) CELLS VIA A FIRST BODY TIE EXTENDING ACROSS THE FIRST AND SECOND ROWS OF IC CELLS, RESPECTIVELY

720

ELECTRICALLY COUPLING A SECOND VOLTAGE RAIL TO A THIRD DIFFUSION REGION IN THE FIRST ROW OF IC CELLS VIA A SECOND BODY TIE SITUATED AT LEAST PARTIALLY WITHIN THE FIRST ROW OF IC CELLS

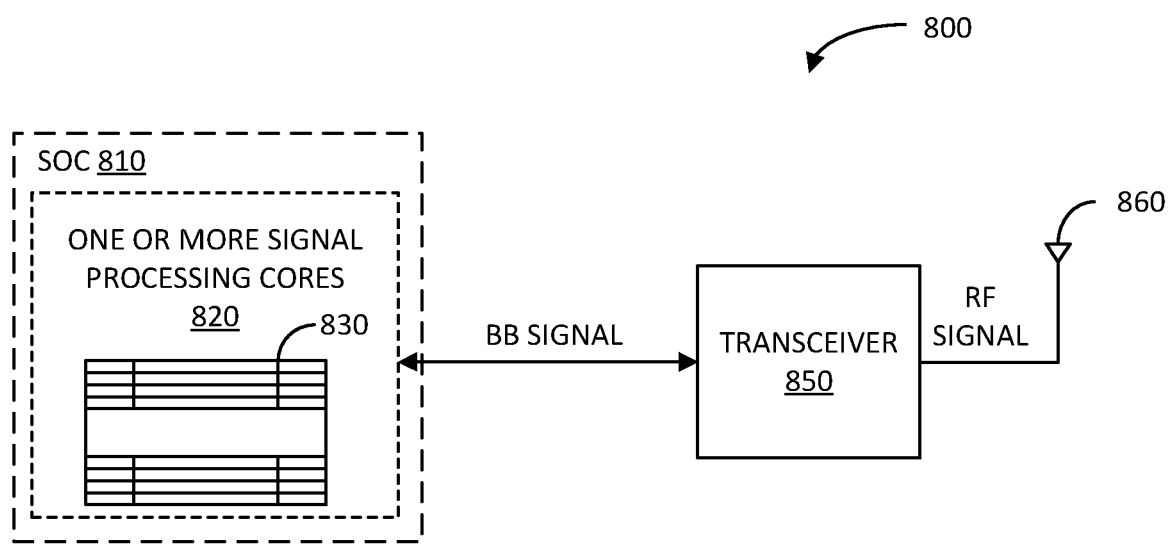

SOC 810

ONE OR MORE SIGNAL PROCESSING CORES 820

830

BB SIGNAL

TRANSCEIVER 850

RF SIGNAL

INTEGRATED CIRCUIT CELL WITH DUAL ROW, BACK-TO-BACK, TRANSISTOR BODY TIES

FIELD

Aspects of the present disclosure relate generally to integrated circuits (ICs), and in particular, to an integrated circuit (IC) cell with dual standard cell row, back-to-back, field effect transistor (FET) body ties.

BACKGROUND

An integrated circuit (IC) may include a two-dimensional array of signal processing complementary metal oxide semiconductor (CMOS) cells (also known as standard cells). Each signal processing CMOS cell may include one or more p-channel metal oxide semiconductor field effect transistors (PMOS FETs) and one or more n-channel metal oxide semiconductor field effect transistors (NMOS FETs). Typically, the PMOS FETs are formed on a continuous n+ diffusion region or N-well extending along a row of cells, and the NMOS FETs are formed on a continuous p+ diffusion substrate region also extending along the row of cells. To provide latch-up coverage for the PMOS FETs and NMOS FETs, p- and n-body ties are provided to electrically coupled upper and lower voltage rails Vdd and Vss to the n+ and p+ diffusion regions of the PMOS FETs and NMOS FETs, respectively.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes a first row of cells including a first set of one or more complementary metal oxide semiconductor (CMOS) signal processing cells including a first diffusion region; a second row of cells including a second set of one or more CMOS signal processing cells including a second diffusion region; and a first body tie electrically coupling a first voltage rail to the first and second diffusion regions.

Another aspect of the disclosure relates to a method. The method includes electrically coupling a first voltage rail to first and second diffusion regions in first and second rows of integrated circuit (IC) cells via a first body tie extending across the first and second rows of IC cells, respectively; and electrically coupling a second voltage rail to a third diffusion region in the first row of IC cells via a second body tie situated at least partially within the first row of IC cells.

Another aspect of the disclosure relates to an apparatus. The apparatus includes first means for electrically coupling a first voltage rail to first and second diffusion regions in first and second rows of integrated circuit (IC) cells, respectively, said first electrically coupling means extending across the first and second rows of IC cells; and second means for electrically coupling a second voltage rail to a third diffusion region in the first row of IC cells, said second electrically coupling means situated at least partially within the first row of IC cells.

Another aspect of the disclosure relates to a wireless communication device. The wireless communication device includes at least one antenna; a transceiver coupled to the at least one antenna; and an integrated circuit (IC) including one or more signal processing cores coupled to the transceiver, wherein the one or more signal processing cores comprises: a first row of cells including a first set of one or more signal processing complementary metal oxide semiconductor (CMOS) cells including a first diffusion region; a second row of cells including a second set of one or more signal processing CMOS cells including a second diffusion region; and a first body tie electrically coupling a first voltage rail to the first and second diffusion regions.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 7 illustrates a flow diagram of an example method of providing latch-up coverage for field effect transistors (FETs) in rows of integrated circuit (IC) cells in accordance with another aspect of the disclosure.

FIG. 8 illustrates a block diagram of an example wireless communication device in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
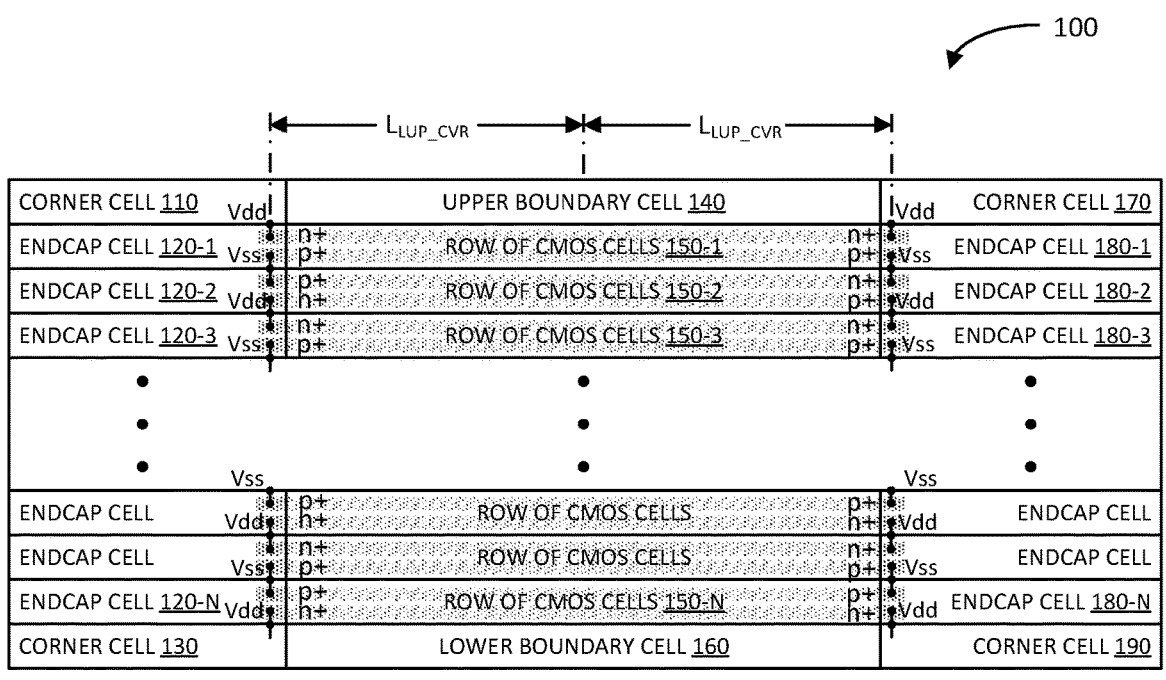
FIG. 1 illustrates a layout view of an example integrated circuit (IC) in accordance with an aspect of the disclosure.

FIG. 1 illustrates a layout view of an example integrated circuit (IC) 100 in accordance with an aspect of the disclosure. The IC 100 includes a two-dimensional array of IC cells; and in this example, the array is an N+2 row by three (3) column cell array.

More specifically, the IC 100 includes a central column including an upper boundary cell 140, N sets (rows) of one or more signal processing complementary metal oxide semiconductor (CMOS) (also referred to as "standard") cells 150-1 to 150-N, and a lower boundary cell 160, all of which are substantially aligned in the column dimension. The IC 100 further includes a left column including an upper-left corner cell 110, N set (rows) of left endcap cells 120-1 to 120-N, and a lower-left corner cell 130, all of which are substantially aligned in the column dimension. Similarly, the IC 100 further includes a right column including an upper-right corner cell 170, N set (rows) of right endcap cells 180-1 to 180-N, and a lower-right corner cell 190, all of which are substantially aligned in the column dimension.

The upper row of IC cells including the upper-left corner cell 110, the upper boundary cell 140, and the upper-right corner cell 170 are substantially aligned in the row dimension. The rows of IC cells including the set of left endcap cells 120-1 to 120-N, the sets of one or more signal processing CMOS cells 150-1 to 150-N, and the set of right endcap cells 180-1 to 180-N are substantially aligned in the row dimension, respectively. The lower row including the lower-left corner cell 130, the lower boundary cell 160, and the lower-right corner cell 190 are substantially aligned in the row dimension.

Each row of CMOS cells 150-1 to 150-N may include one or more CMOS cells staggered in the row dimension, wherein each of the CMOS cells may be defined in a standard cell library. As examples, each CMOS cell may functionally process one or more signals, and may be implemented as an inverter, OR gate, NOR gate, AND gate, NAND gate, XOR gate, XNOR gate, AOI gate, OAI gate, flip-flop, latch, buffer, multiplexer, comparator, and other. The one or more CMOS cells in each row includes a common n+ diffusion region (shown as a shaded region) associated with one or more p-channel metal oxide semiconductor field effect transistors (PMOS FETs). The one or more CMOS cells in each row also includes a common p+ diffusion region (also shown as a shaded region) associated with one or more n-channel metal oxide semiconductor field effect transistors (NMOS FETs).

If the substrate upon which the IC 100 is formed is a p-typed doped substrate, the n+ diffusion region is coupled to an n-well, which includes the p+ regions of the source and drains of the PMOS FETs; and the p+ diffusion region is coupled to the p-doped substrate, which includes the n+ regions of the source and drains of the NMOS FETs. If the substrate upon which the IC 100 is formed is an n-typed doped substrate, the n+ diffusion region is coupled to the n-doped substrate, which includes the p+ regions of the source and drains of the PMOS FETs; and the p+ diffusion region is coupled to a p-well, which includes the n+ regions of the source and drains of the NMOS FETs. It shall be understood that the IC 100 may include other types of FETs, such as one with both an n-well and a p-well.

Typically, the n+ and p+ diffusion regions extend longitudinally, continuously, and horizontally (along the row dimension) across each of the rows of CMOS cells 150-1 to 150-N, and into the corresponding left and right endcap cells 120-1 to 120-N and 180-1 and 180-N, respectively. To prevent latch-up, which is the forwarding biasing of the p-n junction in PMOS FETs and NMOS FETs, an upper supply voltage Vdd (represented as horizontal lines between every other (e.g., odd) pair of rows) is applied to the n+ diffusion region, and a lower supply voltage Vss (represented as horizontal lines between every other (e.g., even) pair of rows) is applied to the p+ diffusion region. Accordingly, the IC 100 includes body ties to effectuate the electrical coupling of the Vdd and Vss voltage rails to the n+ and p+ diffusion regions, respectively. As the n+ diffusion region is associated with PMOS FETs, a p-body tie refers to the Vdd connection to the n+ diffusion region; and as p+ diffusion region is associated with an NMOS FET, an n-body tie refers to the Vss connection to the p+ diffusion region.

As illustrated, each of the left and right endcap cells 120-1 to 120-N and 180-1 to 180-N include a p-body tie and an n-body tie, as indicated by a Vdd-n+ connection and Vss-p+ connection. According to certain design rule checking (DRC) requirements of IC manufacturing foundries, the size of the p-body tie and n-body tie provides a certain length $L_{LUP\_CVR}$ of latch-up (LUP) coverage to the n+ and p+ diffusion regions within the corresponding row of CMOS cells due to their inherent resistance. For example, a six (6) fin size p-body tie or n-body tie may provide a latch-up coverage length $L_{LUP\_CVR}$ of 16 micrometers (μm). Thus, if the length of the rows of CMOS cells 150-1 to 150-N is 32 μm, the p-body ties and n-body ties in the left endcap cells 120-1 to 120-N provide latch-up coverage for the left-half of the rows of CMOS cells 150-1 to 150-N, and the p-body ties and n-body ties in the right endcap cells 180-1 to 180-N provide latch-up coverage for the right-half of the rows of CMOS cells 150-1 to 150-N, respectively.

Figure 2:
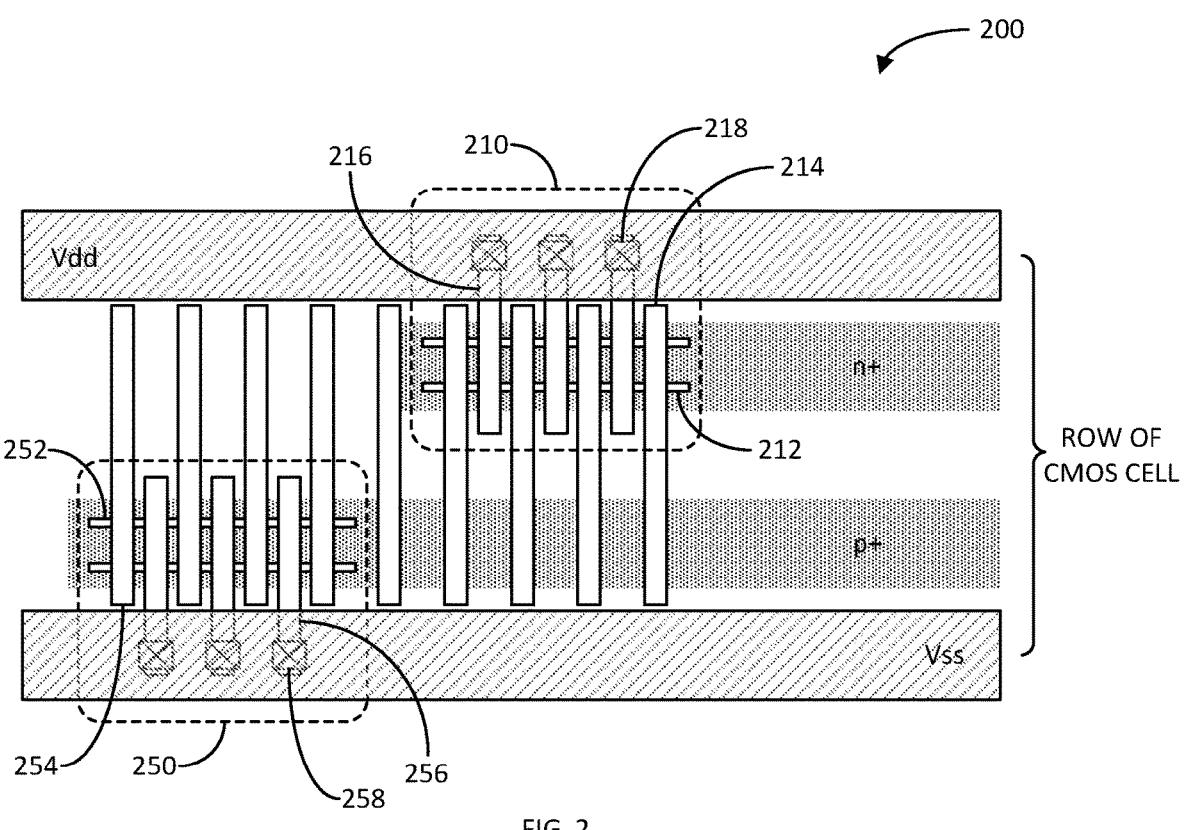
FIG. 2 illustrates a layout view of an example endcap cell in accordance with another aspect of the disclosure.

FIG. 2 illustrates a layout view of an example endcap cell 200 in accordance with another aspect of the disclosure. The endcap cell 200 may be an example of any of the left endcap cells 120-1, 120-3, and 120-(N−1) that includes an upper p-body tie and a lower n-body tie. It shall be understood that a vertically-flipped version of the endcap cell 200 may be an example of any of the left endcap cells 120-2, 120-(N−2), and 120-N that includes an upper n-body tie and a lower p-body tie. It shall be further understood that a horizontally-flipped version of the endcap cell 200 may be an example of any of the right endcap cells 180-1, 180-3, and 180-(N−1) that includes an upper p-body tie and a lower n-body tie. Additionally, it shall be understood that a vertically- and horizontally-flipped version of the endcap cell 200 may be an example of any of the right endcap cells 180-2, 180-(N−2), and 180-N that includes an upper n-body tie and a lower p-body tie. Further, it shall be understood that the endcap cell 200 may include additional components, such as dummy polysilicon gates for terminating rows of cells of the IC 100.

In particular, the endcap cell 200 includes a p-body tie 210 and an n-body tie 250. The p-body tie 210 electrically couples an upper voltage metal rail Vdd to the n+ diffusion region that extends into a corresponding row of CMOS cells. Similarly, the n-body tie 250 electrically couples a lower voltage metal rail Vss to the p+ diffusion region that extends into the corresponding row of CMOS cells.

More specifically, the p-body tie 210 includes a pair of fin structures 212 electrically coupled to, situated over, and extending longitudinally parallel (along the row dimension) with the n+ diffusion region. It shall be understood that the p-body tie 210 may include a single of such fin structure 212 or more than two of such fin structures 212. The p-body tie 210 further includes at least portions of a set of four (4) polysilicon structures 214 situated over and extending longitudinally perpendicular (along the column dimension) to the pair of fin structures 212. It shall be understood that the p-body tie 210 may include two or more of such polysilicon structures 214.

Additionally, the p-body tie 210 includes a set of three (3) metal strips 216 (e.g., middle-of-line (MOL) metallization) electrically coupled to, situated over, and extending longitudinally perpendicular (along the column dimension) to the fin structures 212 in the regions between adjacent polysilicon structures 214, respectively. It shall be understood that the p-body tie 210 may include one or more of such MOL metal strips 216. Further, the p-body tie 210 includes a set of metallized vias 218 electrically coupling the MOL metal strips 216 to the upper voltage metal rail Vdd, respectively. Thus, the upper voltage metal rail Vdd is electrically coupled to the n+ diffusion region via the metallized vias 218, the MOL metal strips 216, and the pair of fin structures 212.

Similarly, the n-body tie 250 includes a pair of fin structures 252 electrically coupled to, situated over, and extending longitudinally parallel (along the row dimension) with the p+ diffusion region. It shall be understood that the n-body tie 250 may include a single of such fin structure 252 or more than two of such fin structures 252. The n-body tie 250 further includes at least portions of a set of four (4) polysilicon structures 254 situated over and extending longitudinally perpendicular (along the column dimension) to the pair of fin structures 252. It shall be understood that the n-body tie 250 may include two or more of such polysilicon structures 254.

Additionally, the n-body tie 250 includes a set of three (3) metal strips 256 (e.g., middle-of-line (MOL) metallization) situated over, electrically coupled to, and extending longitudinally perpendicular (along the column dimension) to the fin structures 252 in the regions between adjacent polysilicon structures 254, respectively. It shall be understood that the n-body tie 250 may include one or more of such MOL metal strips 256. Further, the n-body tie 250 includes a set of metallized vias 258 electrically coupling the MOL metal strips 256 to the lower voltage metal rail Vss, respectively. Thus, the lower voltage metal rail Vss is electrically coupled to the p+ diffusion region via the metallized vias 258, the MOL metal strips 256, and the pair of fin structures 252.

As mentioned above, the length $L_{LUP\_CVR}$ of the latch-up coverage is based on the fin size of the p-body tie 210 and n-body tie 250 (e.g., a 6-fin body tie may have a latch-up coverage of length $L_{LUP\_CVR}$=16 μm). For example, each of the p-body tie 210 and n-body tie 250 has a size of six (6) fins. The fin size of a body tie is calculated by the number of fins between distinct adjacent pairs of polysilicon structures; as these fins 212/252 separately couple to the voltage rails Vdd/Vss via the MOL metal strips 216/256 and metallized vias 218/258. For example, in either the p-body tie 210 or the n-body tie 250, there are two (2) fins between each pair of polysilicon structures, and there are three (3) distinct adjacent pairs of polysilicon structures (e.g., the fin size is 2×3=6). If a longer latch-up coverage length $L_{LUP\_CVR}$ is needed (e.g., $L_{LUP\_CVR}$=30 μm), then the fin size of the p-body tie 210 and the n-body tie 250 should be increased by, for example, increasing the length of the fin structures 212/252 so that they traverse more distinct adjacent pairs (e.g., eight (8)) of the polysilicon structures 214/254 (e.g., a 16-fin body tie).

Figure 3:
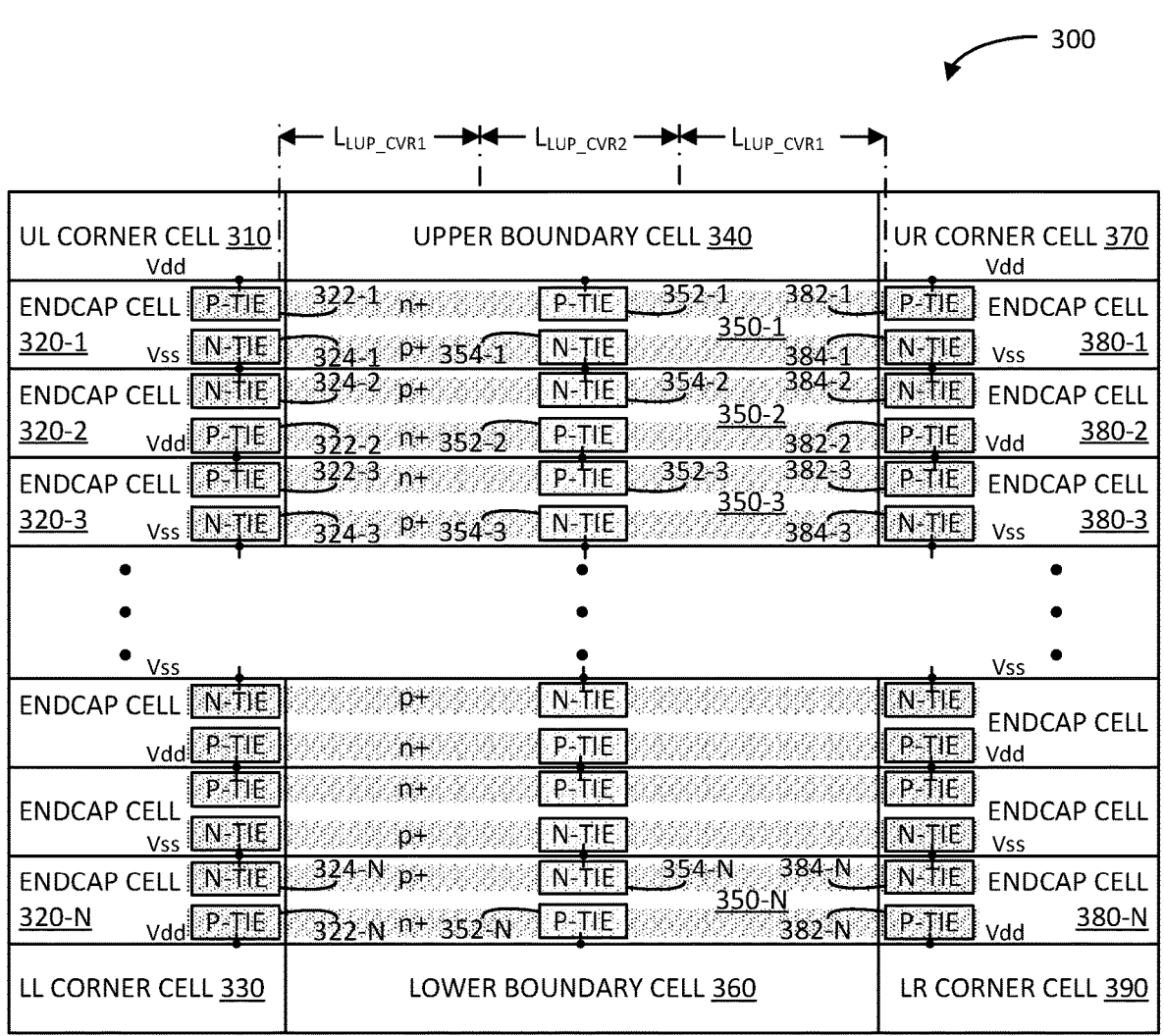
FIG. 3 illustrates a layout view of another example integrated circuit (IC) in accordance with another aspect of the disclosure.

FIG. 3 illustrates a layout view of another example integrated circuit (IC) 300 in accordance with another aspect of the disclosure. The IC 300 is similar to IC 100 including many similar elements as indicated by the same reference numbers with the exception that the most significant digit (MSD) is a "3" in the case of IC 300 instead of a "1" as in the case of IC 100.

That is, in this example, the IC 300 is configured as an N+2 row by three (3) column two-dimensional array of IC cells, comprising: a left column including an upper-left (UL) corner cell 310, a set (rows) of left endcap cells 320-1 to 320-N, and a lower-left (LL) corner cell 330; a middle column including an upper boundary cell 340, sets (rows) of one or more signal processing CMOS cells (aka, "standard" cells) 350-1 to 350-N, and a lower boundary cell 360; and a right column including an upper-right (UR) corner cell 370, a set (rows) of right endcap cells 380-1 to 380-N, and a lower-right (LR) corner cell 390.

The set of left endcap cells 320-1 to 320-N include p-body ties 322-1 to 322-N and n-body ties 324-1 and 324-N, respectively. Similarly, the set of right endcap cells 380-1 to 380-N include p-body ties 382-1 to 382-N and n-body ties 384-1 and 384-N, respectively. The p-body ties 322-1 to 322-N and 382-1 to 382-N electrically couple an upper voltage rail Vdd (represented as horizontal lines between every other (e.g., odd) pair of rows) to n+ diffusion regions (e.g., n-well) within the left endcap cells 320-1 to 320-N, the IC CMOS cells 350-1 to 350-N, and the right endcap cells 380-1 to 380-N, respectively. Similarly, the n-body ties 324-1 to 324-N and 384-1 to 384-N electrically couple a lower voltage rail Vss (represented as horizontal lines between every other (e.g., even) pair of rows) to p+ diffusion regions (e.g., p-substrate) within the left endcap cells 320-1 to 320-N, the IC CMOS cells 350-1 to 350-N, and the right endcap cells 380-1 to 380-N, respectively. As previously mentioned, the n+ diffusion regions are associated with PMOS FETs of the IC CMOS cells, and the p+ diffusion regions are associated with NMOS FETs of the IC CMOS cells.

In this example, the p-body ties 322-1 to 322-N and 382-1 to 382-N and n-body ties 324-1 to 324-N and 384-1 to 384-N may each be implemented as 6-fin body ties. Thus, according to certain DRC requirements, the p-body and n-body ties may each provide a latch-up coverage of length $L_{LUP\_CVR1}$ (e.g., 16 μm). Thus, the p-body ties 322-1 to 322-N and n-body ties 324-1 to 324-N in the left endcap cells 320-1 to 320-N provide, for example, latch-up coverage for the left-end portion (e.g., $L_{LUP\_CVR1}$=16 μm) of the p+ and n+ diffusion regions of the set of IC CMOS cells 350-1 to 350-N, respectively. Similarly, the p-body ties 382-1 to 382-N and n-body ties 384-1 to 384-N in the right endcap cells 380-1 to 380-N provide, for example, latch-up coverage for the right-end portion (e.g., $L_{LUP\_CVR1}$=16 μm) of the p+ and n+ diffusion regions of the IC CMOS cells 350- to 350-N, respectively. Although, in this example, the body ties in the left endcap cells are the same size (e.g., 6 fins) as the body ties in the right endcap cells, it shall be understood that they may be different; meaning that the latch-up coverage for the left-end portion of the IC CMOS cells 350-1 to 350-N may be different than the latch-up coverage for the right-end portion of the IC CMOS cells 350-1 to 350-N.

Further, in accordance with this example, the p+ and n+ diffusion regions in the set of IC CMOS cells 350-1 to 350-N may have a length greater (e.g., 45 μm) than twice the latch-up coverage length $L_{LUP\_CVR1}$ (e.g., 16 μm) provided by the left and right endcap cells 320-1 to 320-N and 380-1 to 380-N, respectively. Thus, in this example, the set of IC CMOS cells 350-1 to 350-N further include a set of intermediate p-body ties 352-1 to 352-N and a set of intermediate n-body ties 354-1 to 354-N, respectively. Similarly, the set of intermediate p-body ties 352-1 to 352-N electrically couple the upper voltage rail Vdd to the n+ diffusion regions of the set of IC CMOS cells 350-1 to 350-N, and the set of intermediate n-body ties 354-1 to 354-N electrically couple the lower voltage rail Vss to the p+ diffusion regions of the set of IC CMOS cells 350-1 to 350-N, respectively.

Similarly, the size of each of the intermediate p-body and n-body ties 352-1 to 352-N and 354-1 to 354-N may be the same as (or optionally different than) the size of each of the p-body and n-body ties of the left and right endcap cells, respectively (e.g., 6-fin size body ties). Thus, the intermediate p-body ties 352-1 to 352-N and n-body ties 354-1 to 354-N provide, for example, latch-up coverage for the middle portion (e.g., $L_{LUP\_CVR2}$=16 μm; between at least two signal processing ("standard") CMOS cells) of the p+ and n+ diffusion regions of the set of IC CMOS cells 350-1 to 350-N, respectively. Accordingly, through the use of the intermediate p-body and n-body ties, and the p-body and n-body ties of the endcap cells, latch-up coverage may be provided for the entire p+ and n+ diffusion regions in the set of IC CMOS cells 350-1 to 350-N, respectively (e.g., 3×16 μm=48 μm>45 μm).

However, a disadvantage of the intermediate body tie approach is that it tends to occupy significant additional IC footprint. As an example, in a certain technology node (e.g., four (4) nanometer (nm) technology node (N4)) and IC implementation, the additional intermediate p-body ties 352-1 to 352-N and n-body ties 354-1 to 354-N may result in a 79 percent (%) IC area penalty. Accordingly, a more IC area efficient approach for providing the additional latch-up coverage for the set of IC CMOS cells 350-1 to 350-N may be desirable.

Figure 4:
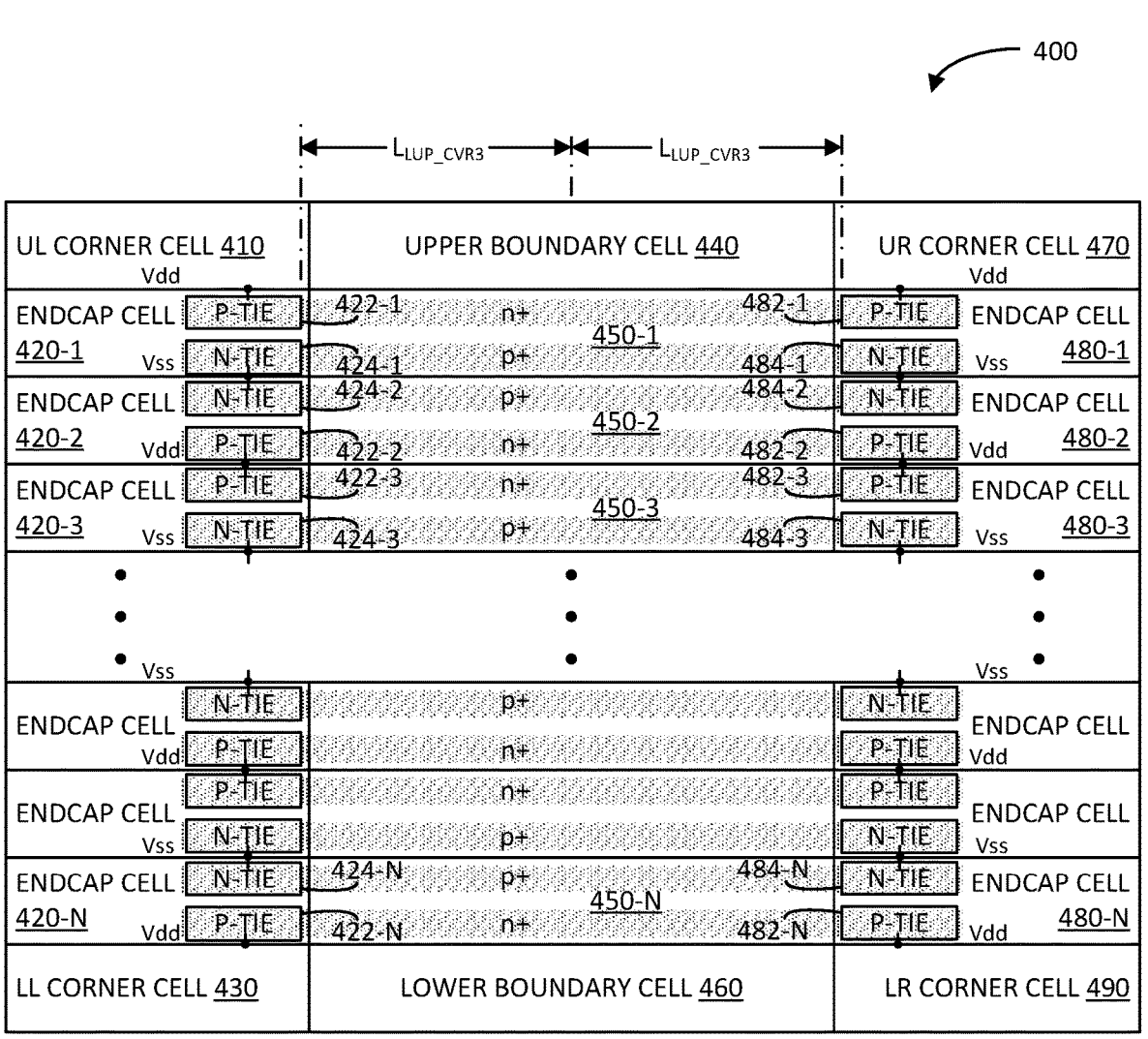
FIG. 4 illustrates a layout view of another example integrated circuit (IC) in accordance with another aspect of the disclosure.

FIG. 4 illustrates a layout view of another example integrated circuit (IC) 400 in accordance with another aspect of the disclosure. The IC 400 is similar to ICs 100 and 300 including many similar elements as indicated by the same reference numbers with the exception that the most significant digit (MSD) is a "4" in the case of IC 400 instead of a "1" and "3" as in the case of ICs 100 and 300, respectively.

That is, in this example, the IC 400 is configured as an N+2 row by three (3) column two-dimensional array of IC cells, comprising: a left column including an upper-left (UL) corner cell 410, a set (rows) of left endcap cells 420-1 to 420-N, and a lower-left (LL) corner cell 430; a middle column including an upper boundary cell 440, sets (rows) of one or more signal processing CMOS cells 450-1 to 450-N, and a lower boundary cell 460; and a right column including an upper-right (UR) corner cell 470, a set (rows) of right endcap cells 480-1 to 480-N, and a lower-right (LR) corner cell 490.

The set of left endcap cells 420-1 to 420-N include p-body ties 422-1 to 422-N and n-body ties 424-1 and 424-N, respectively. Similarly, the set of right endcap cells 480-1 to 480-N include p-body ties 482-1 to 482-N and n-body ties 484-1 and 484-N, respectively. Similarly, the p-body ties 422-1 to 422-N and 482-1 to 482-N electrically couple an upper voltage rail Vdd (represented as horizontal lines between every other (e.g., odd) pair of rows) to n+ diffusion regions (e.g., n-well) within the left endcap cells 420-1 to 420-N, the IC CMOS cells 450-1 to 450-N, and the right endcap cells 480-1 to 480-N, respectively. Similarly, the n-body ties 424-1 to 424-N and 484-1 to 484-N electrically couple a lower voltage rail Vss (represented as horizontal lines between every other (e.g., even) pair of rows) to p+ diffusion regions (e.g., p-substrate) within the left endcap cells 420-1 to 420-N, the IC CMOS cells 450-1 to 450-N, and the right endcap cells 480-1 to 480-N, respectively. As discussed, the n+ diffusion regions are associated with PMOS FETs of the IC CMOS cells, and the p+ diffusion regions are associated with NMOS FETs of the IC CMOS cells.

In the previous example IC 300, the p-body ties 322-1 to 322-N and 382-1 to 382-N and n-body ties 324-1 to 324-N and 384-1 to 384-N were each implemented as a 6-fin body tie. Thus, based on certain DRC requirements, the p-body and n-body ties may each provide a latch-up coverage of length $L_{LUP\_CVR1}$ (e.g., 16 μm). Thus, the p-body ties 322-1 to 322-N and 382-1 to 382-N and n-body ties 324-1 to 324-N and 384-1 to 384-N in the left and right endcap cells 320-1 to 320-N and 380-1 to 380-N provide, for example, latch-up coverage for length of $2*L_{LUP\_CVR1}$=32 μm of the p+ and n+ diffusion regions of the set of IC CMOS cells 350-1 to 350-N, respectively. However, as discussed, the set of IC CMOS cells 350-1 to 350-N may have a length greater (e.g., 45 μm) than the latch-up coverage length of $2*L_{LUP\_CVR1}$=32 μm, which is less than the 45 μm of the p+ and n+ diffusion regions.

In the case of IC 400, the p-body ties 422-1 to 422-N and 482-1 to 482-N and n-body ties 424-1 to 424-N and 484-1 to 484-N are implemented as 16-fin body ties. According to certain DRC requirements, a 16-fin body tie may provide a latch-up coverage of length $L_{LUP\_CVR3}$ of, for example, 30 μm. Thus, the p-body ties 422-1 to 422-N and 482-1 to 482-N and n-body ties 424-1 to 424-N and 484-1 to 484-N in the left and right endcap cells 420-1 to 420-N and 480-1 to 480-N provide, for example, latch-up coverage for length of $2*L_{LUP\_CVR3}$=60 μm of the p+ and n+ diffusion regions of the set of IC CMOS cells 450-1 to 450-N, respectively. Considering the previous similar example IC CMOS cells 450-1 to 450-N with length of 45 μm, the latch-up coverage provided by the 16-fin p-body and n-body ties is sufficient for the entire length of the p+ and n+ diffusion regions of the set of IC CMOS cells 450-1 to 450-N.

However, a disadvantage of the longer (e.g., 16-fin) body tie approach is that it still tends to occupy significant additional IC footprint. As an example, in a certain technology node (e.g., four (4) nm technology node (N4)) and IC implementation, the longer (e.g., 16-fin) p-body ties and n-body ties may result in a 10.5% IC area penalty. This approach may be an improvement over the intermediate p-body and n-body tie approach of IC 300 previously discussed, but still a more IC area efficient approach for providing the additional latch-up coverage for the IC CMOS cells may be desirable.

Figure 5:
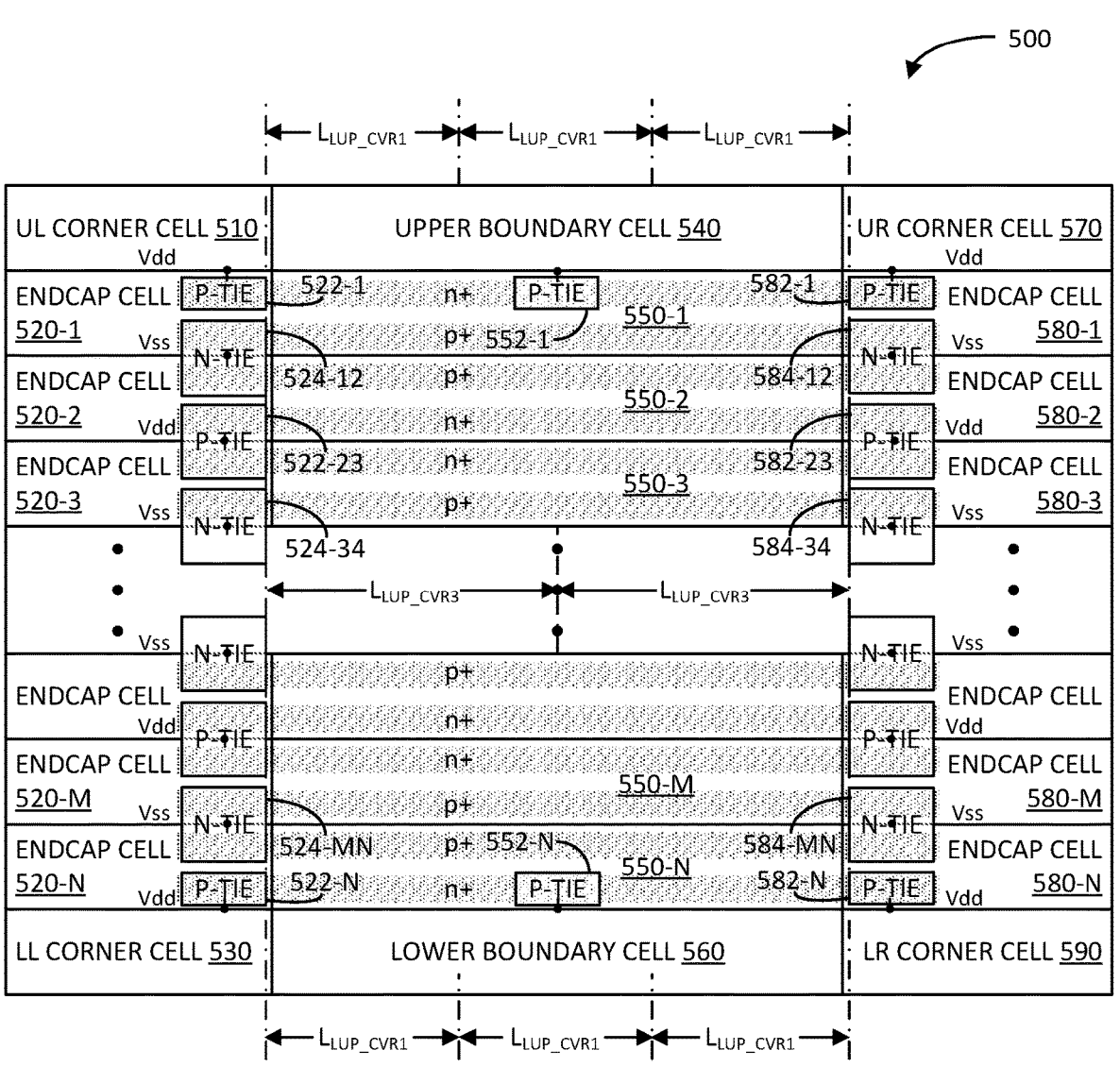
FIG. 5 illustrates a layout view of another example integrated circuit (IC) in accordance with another aspect of the disclosure.

FIG. 5 illustrates a layout view of another example integrated circuit (IC) 500 in accordance with another aspect of the disclosure. As discussed in further detail herein, the IC 500 may be implemented to provide latch-up coverage for rows of IC CMOS cells in a more IC area efficient manner than ICs 300 and 400 previously discussed. The IC 500 is structurally similar to ICs 100, 300, and 400, including many similar elements as indicated by the same reference numbers with the exception that the most significant digit (MSD) is a "5" in the case of IC 500 instead of a "1", "3", and "4" as in the case of ICs 100, 300, and 400, respectively.

That is, the IC 500 is configured as an N+2 row by three (3) column two-dimensional array of IC cells, comprising: a left column including an upper-left (UL) corner cell 510, a set (rows) of left endcap cells 520-1 to 520-N, and a lower-left (LL) corner cell 530; a middle column including an upper boundary cell 540, sets (rows) of one or more signal processing CMOS ("standard") cells 550-1 to 550-N, and a lower boundary cell 560; and a right column including an upper-right (UR) corner cell 570, a set (rows) of right endcap cells 580-1 to 580-N, and a lower-right (LR) corner cell 590.

In this case, each adjacent row pair of the left endcap cells 520-1 to 520-N includes a body tie combined in a back-toback configuration to provide latch-up coverage for two diffusion regions of corresponding adjacent row pair of the IC CMOS cells 550-1 to 550-N, respectively. For example, the adjacent row pair of left endcap cells 520-1 and 520-2 includes an n-body tie 524-12 electrically coupling a lower voltage rail Vss to p+ diffusion regions of adjacent row pair of IC CMOS cells 550-1 and 550-2, respectively. Similarly, the adjacent row pair of left endcap cells 520-2 and 520-3 includes a p-body tie 522-23 electrically coupling an upper voltage rail Vdd to n+ diffusion regions of adjacent row pair of IC CMOS cells 550-2 and 550-3, respectively. Likewise, the adjacent row pair of left endcap cells 520-M (where, M=N−1) and 520-N includes an n-body tie 524-MN electrically coupling the lower voltage rail Vss to p+ diffusion regions of adjacent row pair of IC CMOS cells 550-M and 550-N, respectively.

Similarly, each adjacent row pair of the right endcap cells 580-1 to 580-N includes a body tie combined in a back-to-back configuration to provide latch-up coverage for two diffusion regions of corresponding adjacent row pair of the IC CMOS cells 550-1 to 550-N, respectively. For example, the adjacent row pair of right endcap cells 580-1 and 580-2 includes an n-body tie 584-12 electrically coupling the lower voltage rail Vss to the p+ diffusion regions of adjacent row pair of IC CMOS cells 550-1 and 550-2, respectively. Similarly, the adjacent row pair of right endcap cells 580-2 and 580-3 includes a p-body tie 582-23 electrically coupling the upper voltage rail Vdd to n+ diffusion regions of adjacent row pair of IC CMOS cells 550-2 and 550-3, respectively. Likewise, the adjacent row pair of right endcap cells 580-M and 580-N includes an n-body tie 584-MN electrically coupling the lower voltage rail Vss to p+ diffusion regions of adjacent row pair of IC CMOS cells 550-M and 550-N, respectively.

Further, the top left and right endcap cells include body ties that are coupled to a single diffusion region of the top row of IC CMOS cells. For example, the top left and right endcap cells 520-1 and 580-1 include p-body ties that are coupled to the n+ diffusion region of the top row of IC CMOS cells 550-1. It shall be understood that if the top row of IC CMOS cells 550-1 was arranged with the p+ diffusion region closer to the upper boundary cell 540 than the n+ diffusion region (e.g., if the p+ and n+ diffusion regions were flipped in the row of IC CMOS cells 550-1), the top left and right endcap cells 520-1 and 580-1 would include n-body ties coupled to the p+ diffusion region of the top row of IC CMOS cells 550-1.

Similarly, the bottom left and right endcap cells include body ties that are coupled to a single diffusion region of the bottom row of IC CMOS cells. For example, the bottom left and right endcap cells 520-N and 580-N include p-body ties that are coupled to the n+ diffusion region of the bottom row of IC CMOS cells 550-N. Similarly, it shall be understood that if the bottom row of IC CMOS cells 550-N was arranged with the p+ diffusion region closer to the lower boundary cell 560 than the n+ diffusion region (e.g., if the p+ and n+ diffusion regions were flipped in the row of IC CMOS cells 550-N), the bottom left and right endcap cells 520-N and 580-N would include n-body ties coupled to the p+ diffusion region of the bottom row of IC CMOS cells 550-N.

Considering the previous example of the length of the p+ and n+ diffusion regions being 45 μm, the combined body ties that span two adjacent rows may be implemented with 16 fins (e.g., an 8-fin body tie back-to-back combined with another 8-fin body tie). According to certain DRC, each 16-fin body tie may provide latch-up coverage for a length $L_{LUP\_CVR3}$ of 30 μm. Thus, the combined body tie in each adjacent row pair of left and right endcap cells should provide latch-up coverage for the entire length of the corresponding diffusion regions of the corresponding adjacent row pair of IC cells (e.g., 2*30 μm=60 μm>45 μm). Thus, the n-body ties 524-12 and 584-12 of adjacent row pair of left and right endcap cells 520-1/520-2 and 580-1/580-2 provide latch-up coverage for the entire length of the p+ diffusion regions of adjacent row pairs of IC cells 550-1 and 550-2, respectively; the p-body ties 522-23 and 582-23 of adjacent row pair of left and right endcap cells 520-2/520-3 and 580-2/580-3 provide latch-up coverage for the entire length of the n+ diffusion regions of adjacent row pairs of IC cells 550-2 and 550-3, respectively; and so on, to the n-body ties 524-MN and 584-MN of adjacent row pair of left and right endcap cells 520-M/520-N and 580-M/580-N provide latch-up coverage for the entire length of the p+ diffusion regions of adjacent row pairs of IC cells 550-M and 550-N, respectively As discussed above, the top/bottom and left/right endcap cells 520-1/520-N and 580-1/580-N include p-body ties 522-1/522-N and 582-1/582-N coupled to n+ diffusion regions of the top and bottom rows of IC cells 550-1 and 550-N, respectively. As the p-body ties 522-1/522-N and 582-1/582-N are not back-to-back combined, each may have a size of 8 fins. Thus, each of the p-body ties 522-1/522-N and 582-1/582-N may provide a latch-up coverage length $L_{LUP\_CVR1}$ of 16 μm. As such, the top row p-body ties 522-1 and 582-1 and the bottom row p-body ties 522-N and 522-N may not provide latch-up coverage for the entire length of the n+ diffusion regions of the top and bottom rows of IC CMOS cells 550-1 and 550-N, respectively (e.g., 2*16 μm=32 μm<45 μm). Accordingly, the top and bottom rows of IC CMOS cells 550-1 and 550-N may include an intermediate p-body tie 552-1 and 552-N that are each configured with 8 fins to provide an additional 16 μm in the middle region of the n+ diffusion regions of the top and bottom rows of IC CMOS cells 550-1 and 550-N so that latch-up coverage for the entire length of the n+ diffusion regions is provided, respectively (e.g., 3*16 μm=48 μm<45 μm).

Figure 6:
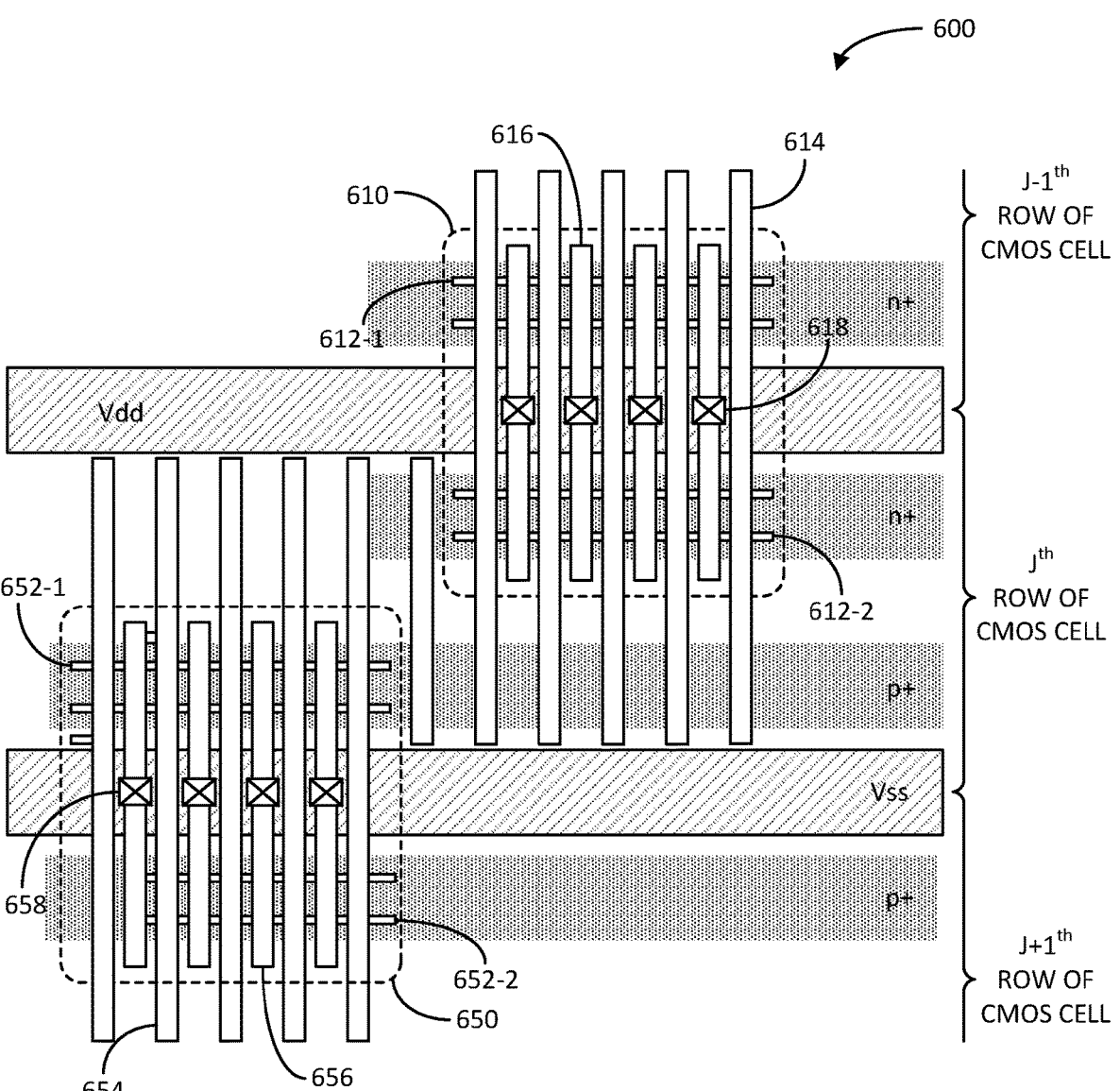
FIG. 6 illustrates a layout view of another example endcap cell in accordance with another aspect of the disclosure.

FIG. 6 illustrates a layout view of another example endcap cell 600 in accordance with another aspect of the disclosure. The endcap cell 600 may be an example of left endcap cell 520-3 or other similarly configured left endcap cells, such as endcap cell 520-M. As discussed further herein, the left endcap cell 600 includes a back-to-back combined p-body tie on the upper side of the cell and a back-to-back combined n-body tie on the lower side of the cell. The other left endcap cell configuration, such as endcap cell 520-2, includes a back-to-back combined n-body tie on the upper side of the cell and a back-to-back combined p-body tie on the lower side of the cell; but otherwise, the configuration is substantially similar (e.g., a vertically flipped version of the left endcap cell 600).

Further, the top and bottom left endcap cells 520-1 and 520-N may be structurally similar to left endcap cell 600 with the exception that one of the body ties is a single body tie (e.g., not a back-to-back combined body tie) electrically coupling a voltage rail to a single diffusion region of the corresponding row of IC CMOS cells, and some are otherwise vertically flipped. For example, the top left endcap cell 520-1 includes a single p-body tie 522-1 electrically coupling the upper voltage rail Vdd to the n+ diffusion region of the row of IC CMOS cells 550-1, and a back-to-back combined n-body tie 524-12. Similarly, the bottom left endcap cell 520-N includes a single p-body tie 522-N electrically coupling the upper voltage rail Vdd to the n+ diffusion region of the row of IC CMOS cells 550-N, and a back-to-back combined n-body tie 524-12.

In a similar vein, it shall also be understood that the right endcap cells 580-1 to 580-N may be a horizontally-flipped version of the left endcap cell 600, a horizontally- and vertically-flipped version of the left endcap cell 600, a horizontally-flipped version of the left endcap cell 600 with one of its body tie being a single body tie, and a horizontally- and vertically-flipped version of the left endcap cell 600 with one of its body tie being a single body tie.

In particular, the endcap cell 600 includes a back-to-back combined p-body tie 610 and a back-to-back combined n-body tie 650. The back-to-back combined p-body tie 610 electrically couples an upper voltage metal rail Vdd to the n+ diffusion regions of two adjacent rows $J-1^{th}$ and $J^{th}$ of IC CMOS cells, respectively. Similarly, the back-to-back combined n-body tie 650 electrically couples a lower voltage metal rail Vss to the p+ diffusion regions of another two adjacent rows $J^{th}$ and $J+1^{th}$ of IC CMOS cells, respectively.

More specifically, the back-to-back combined p-body tie 610 includes a first pair of fin structures 612-1 electrically coupled to, longitudinally extending horizontally parallel (along the row dimension) with, and situated over the n+ diffusion region of the $J-1^{th}$ row of IC cells. It shall be understood that the p-body tie 610 may include a single of such fin structure 612-1 or more than two of such fin structures 612-1. The back-to-back combined p-body tie 610 further includes a second pair of fin structures 612-2 electrically coupled to, extending horizontally parallel (along the row dimension) with, and situated over the n+ diffusion region of the $J^{th}$ row of IC cells. It shall be understood that the p-body tie 610 may include a single of such fin structure 612-2 or more than two of such fin structures 612-2. The p-body tie 610 further includes at least portions of a set of five (5) polysilicon structures 614 situated over and longitudinally extending perpendicular (along the column dimension) to the pairs of fin structures 612-1 and 612-2. It shall be understood that the p-body tie 610 may include two or more of such polysilicon structures 614.

Additionally, the p-body tie 610 includes a set of four (4) metal strips 616 (e.g., middle-of-line (MOL) metallization) electrically coupled to and longitudinally extending perpendicular (in the column dimension) to the fin structures 612-1 and 612-2 in the regions between adjacent polysilicon structures 614. It shall be understood that the p-body tie 610 may include one or more MOL metal strips 616. Further, the p-body tie 610 includes a set of metallized vias 618 electrically coupling the MOL metal strips 616 to the upper voltage metal rail Vdd, respectively. Thus, the upper voltage metal rail Vdd is electrically coupled to the n+ diffusion regions of adjacent rows $J-1^{th}$ and $J^{th}$ of IC CMOS cells via the metallized vias 618, the MOL metal strips 616, and the pairs of fin structures 612-1 and 612-2, respectively.

Similarly, the back-to-back combined n-body tie 650 includes a first pair of fin structures 652-1 electrically coupled to, longitudinally extending horizontally parallel (along the row dimension) with, and situated over the p+ diffusion region of the $J^{th}$ row of IC cells. It shall be understood that the n-body tie 650 may include a single of such fin structure 652-1 or more than two of such fin structures 652-1. The back-to-back combined n-body tie 650 further includes a second pair of fin structures 652-2 electrically coupled to, extending horizontally parallel (along the row dimension) with, and situated over the p+ diffusion region of the $J+1^{th}$ row of IC cells. It shall be understood that the n-body tie 650 may include a single of such fin structure 652-2 or more than two of such fin structures 652-2. The n-body tie 650 further includes at least portions of a set of five (5) polysilicon structures 654 situated over and longitudinally extending perpendicular (along the column dimension) to the pairs of fin structures 652-1 and 652-2. It shall be understood that the n-body tie 650 may include two or more of such polysilicon structures 654.

Additionally, the n-body tie 650 includes a set of four (4) metal strips 656 (e.g., middle-of-line (MOL) metallization) electrically coupled to and longitudinally extending perpendicular (along the column dimension) to the fin structures 652-1 and 652-2 in the regions between adjacent polysilicon structures 654. It shall be understood that the n-body tie 650 may include one or more MOL metal strips 656. Further, the n-body tie 650 includes a set of metallized vias 658 electrically coupling the MOL metal strips 656 to the lower voltage metal rail Vss, respectively. Thus, the lower voltage metal rail Vss is electrically coupled to the p+ diffusion regions of adjacent rows $J^{th}$ and $J+1^{th}$ of IC CMOS cells via the metallized vias 658, the MOL metal strips 656, and the first and second pairs of fin structures 652-1 and 652-2, respectively.

FIG. 7 illustrates a flow diagram of an example method 700 of providing latch-up coverage for field effect transistors (FETs) in rows of integrated circuit (IC) cells in accordance with another aspect of the disclosure.

The method 700 includes electrically coupling a first voltage rail to first and second diffusion regions in first and second rows of integrated circuit (IC) cells via a first body tie extending across the first and second rows of IC cells, respectively (block 710). Examples of means for electrically coupling a first voltage rail to first and second diffusion regions in first and second rows of integrated circuit (IC) cells include the n-body ties 524-12, 584-12, 524-34, 584-34 . . . 524-MN, and 584-MN of IC 500, the p-body ties 522-23, 582-23 . . . of IC 500, and n-body tie 650 and p-body tie 610 of endcap 600.

The method 700 further includes electrically coupling a second voltage rail to a third diffusion region in the first row of IC cells via a second body tie situated at least partially within the first row of IC cells (block 720). Examples of means for electrically coupling a second voltage rail to a third diffusion region in the first row of IC cells include the n-body ties 524-12, 584-12, 524-34, 584-34 . . . 524-MN, and 584-MN of IC 500, the p-body ties 522-1, 582-1, 522-23, 582-23 . . . 522-N, and 582-N of IC 500, and n-body tie 650 and p-body tie 610 of endcap 600.

The method 700 may further include electrically coupling the second voltage rail to a fourth diffusion region in the third row of IC cells via the second body. Examples of means for electrically coupling the second voltage rail to a fourth diffusion region in the third row of IC cells include the n-body ties 524-12, 584-12, 524-34, 584-34 . . . 524-MN, and 584-MN of IC 500, the p-body ties 522-23, 582-23 . . . of IC 500, and n-body tie 650 and p-body tie 610 of endcap 600.

Additionally, the method 700 may include electrically coupling the first voltage rail to the first and second diffusion regions via a third body tie extending across the first and second rows of IC cells, respectively. Examples of means for electrically coupling the first voltage rail to the first and second diffusion regions include the n-body ties 524-12, 584-12, 524-34, 584-34 . . . 524-MN, and 584-MN of IC 500, the p-body ties 522-23, 582-23 . . . of IC 500, and n-body tie 650 and p-body tie 610 of endcap 600.

FIG. 8 illustrates a block diagram of an example wireless communication device 800 in accordance with another aspect of the disclosure. The wireless communication device

800 may be a smart phone, a desktop computer, laptop computer, tablet device, Internet of Things (IoT), wearable wireless device (e.g., wireless watch), and other types of wireless device.

In particular, the wireless communication device 800 includes an integrated circuit (IC), which may be implemented as a system on chip (SOC) 810. The SOC 810 includes one or more signal processing cores 820, which may be implemented with a two-dimensional array of IC cells 830 including body ties spanning two rows of IC cells per IC 500 and endcap 600 previously discussed. The one or more signal processing cores 820 may be configured to generate a transmit baseband (BB) signal and process a received baseband (BB) signal.

The wireless communication device 800 may further include a transceiver 850 and at least one antenna 860 (e.g., an antenna array). The transceiver 850 is coupled to the one or more signal processing cores 820 to receive therefrom the transmit BB signal and provide thereto the received BB signal. The transceiver 850 is configured to convert the transmit BB signal into a transmit radio frequency (RF) signal, and convert a received RF signal into the received BB signal. The transceiver 850 is coupled to the at least one antenna 860 to provide thereto the transmit RF signal for electromagnetic radiation into a wireless medium for wireless transmission, and receive the received RF signal electromagnetically picked up from the wireless medium by the at least one antenna 860.

The following provides an overview of aspects of the present disclosure:

Aspect 1: An integrated circuit (IC), comprising: a first row of cells including a first set of one or more signal processing complementary metal oxide semiconductor (CMOS) cells including a first diffusion region; a second row of cells including a second set of one or more signal processing CMOS cells including a second diffusion region; and a first body tie electrically coupling a first voltage rail to the first and second diffusion regions.

Aspect 2: The IC of aspect 1, wherein: the first row of cells includes a first endcap comprising a first portion of the first body tie; and the second row of cells includes a second endcap cell comprising a second portion of the first body tie.

Aspect 3: The IC of aspect 1 or 2, wherein the first row of cells includes a third diffusion region, and further comprising: a third row of cells including a third set of one or more signal processing CMOS cells including a fourth diffusion region; and a second body tie electrically coupling a second voltage rail to the third and fourth diffusion regions.

Aspect 4: The IC of aspect 3, wherein: the first row of cells includes a first endcap cell comprising a first portion of the first body tie and a first portion of the second body tie; the second row of cells includes a second endcap cell comprising a second portion of the first body tie; and the third row of cells includes a third endcap cell comprising a second portion of the second body tie.

Aspect 5: The IC of aspect 3 or 4, wherein: the first body tie comprises an n-body tie, the first voltage rail comprises a lower voltage rail, and the first and second diffusion regions comprise p+ diffusion regions, and the second body tie comprises a p-body tie, the second voltage rail comprises an upper voltage rail, and the third and fourth diffusion regions comprise n+ diffusion regions.

Aspect 6: The IC of aspect 3 or 4, wherein: the first body tie comprises a p-body tie, the first voltage rail comprises an upper voltage rail, and the first and second diffusion regions comprise n+ diffusion regions, and the second body tie comprises an n-body tie, the second voltage rail comprises a lower voltage rail, and the third and fourth diffusion regions comprise p+ diffusion regions.

Aspect 7: The IC of aspect 1 or 2, wherein the first row of cells includes a third diffusion region, and further comprising a second body tie electrically coupling a second voltage rail to the third diffusion region.

Aspect 8: The IC of aspect 7, further comprising a corner cell situated adjacent to the first row of cells in a column dimension.

Aspect 9: The IC of aspect 7 or 8, further comprising a third body tie electrically coupling the second voltage rail to the third diffusion region, wherein the third body tie is situated between two signal processing CMOS cells of the first set.

Aspect 10: The IC of aspect 9, wherein the second body tie and the third body ties are substantially the same size, but smaller than the first body tie.

Aspect 11: The IC of any one of aspects 1-10, further comprising a second body tie electrically coupling the first voltage rail to the first and second diffusion regions.

Aspect 12: The IC of aspect 11, wherein: the first row of cells comprises: a first left endcap cell comprising a first portion of the first body tie; and a first right endcap cell comprising a first portion of the second body tie; and the second row of cells comprises: a second left endcap cell comprising a second portion of the first body tie; and a second right endcap cell comprising a second portion of the second body tie.

Aspect 13: The IC of aspect 11 or 12, wherein the first row of cells includes a third diffusion region, and further comprising: a third row of cells including a third set of one or more signal processing CMOS cells including a fourth diffusion region; a third body tie electrically coupling a second voltage rail to the third and fourth diffusion regions; and a fourth body tie electrically coupling the second voltage rail to the third and fourth diffusion regions.

Aspect 14: The IC of aspect 13, wherein: the first left endcap cell comprises a first portion of the third body tie; the third row of cells includes a third left endcap cell comprising a second portion of the third body tie; the first right endcap cell comprises a first portion of the fourth body tie; and the third row of cells includes a third right endcap cell comprising a second portion of the fourth body tie.

Aspect 15: The IC of aspect 12, wherein: the first row of cells includes a third diffusion region; wherein the first left endcap cell includes a third body tie electrically coupling a second voltage rail to the third diffusion region; and wherein the first right endcap cell includes a fourth body tie electrically coupling the second voltage rail to the third diffusion region.

Aspect 16: The IC of aspect 15, further comprising: a left corner cell situated adjacent to the first left endcap cell in a column dimension; and a right corner cell situated adjacent to the first right endcap cell in the column dimension.

Aspect 17: The IC of aspect 15 or 16, further comprising a fifth body tie electrically coupling the second voltage rail to the third diffusion region, wherein the third body tie is situated between the first left endcap cell and the first right endcap cell.

Aspect 18: The IC of aspect 17, wherein the third, fourth, and fifth body ties are substantially the same size, but smaller than the first and second body ties.

Aspect 19: The IC of any one of aspects 1-18, wherein the first body tie comprises: a first set of one or more parallel fin structures situated over and electrically coupled to the first diffusion region, wherein the first set of one or more parallel fin structures extend longitudinally along a row dimension; a second set of one or more parallel fin structures situated over and electrically coupled to the second diffusion region, wherein the first set of one or more parallel fin structures extend longitudinally along the row dimension; and a set of one or more metal strips electrically coupling the first set of one or more parallel fin structures to the second set of one or more parallel fin structures, wherein the set of one or more metal strips extend longitudinally along a column dimension, and wherein the set of one or more metal strips are electrically coupled to the first voltage rail.

Aspect 20: The IC of aspect 19, wherein the first body tie comprises a set of polysilicon structures extending longitudinally along the column dimension, wherein the set of one or more metal strips are situated between the set of polysilicon structures, respectively.

Aspect 21: A method including electrically coupling a first voltage rail to first and second diffusion regions in first and second rows of integrated circuit (IC) cells via a first body tie extending across the first and second rows of IC cells, respectively; and electrically coupling a second voltage rail to a third diffusion region in the first row of IC cells via a second body tie situated at least partially within the first row of IC cells.

Aspect 22: The method of aspect 21, wherein the second body tie extends into a third row of IC cells, and further comprising electrically coupling the second voltage rail to a fourth diffusion region in the third row of IC cells via the second body tie.

Aspect 23: The method of aspect 21 or 22, wherein the first row of IC cells comprises a first endcap cell, wherein the first body tie is partially within the first endcap cell, and wherein the second body tie is at least partially within the first endcap cell.

Aspect 24: The method of aspect 23, wherein the second row of IC cells includes a second endcap cell, wherein the first body tie is partially within the second endcap cell.

Aspect 25: The method of any one of aspects 21-24, further comprising electrically coupling the first voltage rail to the first and second diffusion regions via a third body tie extending across the first and second rows of IC cells, respectively.

Aspect 26: The method of aspect 25, wherein the first row of IC cells includes a first left endcap cell and a first right endcap cell, wherein the first body tie is partially within the first left endcap cell, and wherein the third body tie is partially within the first right endcap cell.

Aspect 27: The method of aspect 26, wherein the second row of IC cells includes a second left endcap cell and a second right endcap cell, wherein the first body tie is partially within the second left endcap cell, and wherein the third body tie is partially within the second right endcap cell.

Aspect 28: An apparatus, comprising: first means for electrically coupling a first voltage rail to first and second diffusion regions in first and second rows of integrated circuit (IC) cells, respectively, said first electrically coupling means extending across the first and second rows of IC cells; and second means for electrically coupling a second voltage rail to a third diffusion region in the first row of IC cells, said second electrically coupling means situated at least partially within the first row of IC cells.

Aspect 29: The apparatus of aspect 28, wherein the second electrically coupling means extends into a third row of IC cells, and wherein the second electrically coupling means couples the second voltage rail to a fourth diffusion region in the third row of IC cells.

Aspect 30: A wireless communication device comprising: at least one antenna; a transceiver coupled to the at least one antenna; and an integrated circuit (IC) including one or more signal processing cores coupled to the transceiver, wherein the one or more signal processing cores comprises: a first row of cells including a first set of one or more signal processing complementary metal oxide semiconductor (CMOS) cells including a first diffusion region; a second row of cells including a second set of one or more signal processing CMOS cells including a second diffusion region; and a first body tie electrically coupling a first voltage rail to the first and second diffusion regions.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:
a first row of cells including a first set of one or more signal processing complementary metal oxide semiconductor (CMOS) cells including a first diffusion region;
a second row of cells including a second set of one or more signal processing CMOS cells including a second diffusion region; and
a first body tie electrically coupling a first voltage rail to the first and second diffusion regions;
wherein the first row of cells includes a third diffusion region, the IC further comprising a second body tie electrically coupling a second voltage rail to the third diffusion region, wherein the second body tie is substantially aligned with the first body tie in a column dimension.

2. The IC of claim 1, wherein:
the first row of cells includes a first endcap cell comprising a first portion of the first body tie; and
the second row of cells includes a second endcap cell comprising a second portion of the first body tie.

3. The IC of claim 1, further comprising:
a third row of cells including a third set of one or more signal processing CMOS cells including a fourth diffusion region; and
the second body tie further electrically coupling the second voltage rail to the fourth diffusion region.

4. The IC of claim 3, wherein:
the first row of cells includes a first endcap cell comprising a first portion of the first body tie and a first portion of the second body tie;
the second row of cells includes a second endcap cell comprising a second portion of the first body tie; and
the third row of cells includes a third endcap cell comprising a second portion of the second body tie.

5. The IC of claim 3, wherein:
the first body tie comprises an n-body tie, the first voltage rail comprises a lower voltage rail, and the first and second diffusion regions comprise p+ diffusion regions, and
the second body tie comprises a p-body tie, the second voltage rail comprises an upper voltage rail, and the third and fourth diffusion regions comprise n+ diffusion regions.

6. The IC of claim 3, wherein:

the first body tie comprises a p-body tie, the first voltage rail comprises an upper voltage rail, and the first and second diffusion regions comprise n+ diffusion regions, and the second body tie comprises an n-body tie, the second voltage rail comprises a lower voltage rail, and the third and fourth diffusion regions comprise p+ diffusion regions.

7. The IC of claim 1, further comprising a corner cell situated adjacent to the first row of cells in a column dimension.

8. The IC of claim 1, further comprising a third body tie electrically coupling the second voltage rail to the third diffusion region, wherein the third body tie is situated between two signal processing CMOS cells of the first set.

9. The IC of claim 8, wherein the second body tie and the third body ties are substantially the same size, but smaller than the first body tie.

10. The IC of claim 1, further comprising a third body tie electrically coupling the first voltage rail to the first and second diffusion regions.

11. The IC of claim 10, wherein:

the first row of cells comprises:

a first left endcap cell comprising a first portion of the first body tie; and a first right endcap cell comprising a first portion of the third body tie; and the second row of cells comprises:

a second left endcap cell comprising a second portion of the first body tie; and a second right endcap cell comprising a second portion of the third body tie.

12. The IC of claim 11, further comprising:

a third row of cells including a third set of one or more signal processing CMOS cells including a fourth diffusion region, the second body tie further electrically coupling the second voltage rail to the fourth diffusion region; and a fourth body tie electrically coupling the second voltage rail to the third and fourth diffusion regions.

13. The IC of claim 12, wherein:

the first left endcap cell comprises a first portion of the second body tie;

the third row of cells includes a third left endcap cell comprising a second portion of the second body tie;

the first right endcap cell comprises a first portion of the fourth body tie; and the third row of cells includes a third right endcap cell comprising a second portion of the fourth body tie.

14. The IC of claim 11, wherein the first left endcap cell includes the second body tie electrically coupling the second voltage rail to the third diffusion region; and wherein the first right endcap cell includes a fourth body tie electrically coupling the second voltage rail to the third diffusion region.

15. The IC of claim 14, further comprising:

a left corner cell situated adjacent to the first left endcap cell in a column dimension; and a right corner cell situated adjacent to the first right endcap cell in the column dimension.

16. The IC of claim 14, further comprising a fifth body tie electrically coupling the second voltage rail to the third diffusion region, wherein the fifth body tie is situated between the first left endcap cell and the first right endcap cell.

17. The IC of claim 16, wherein the second, fourth, and fifth body ties are substantially the same size, but smaller than the first and third body ties.

18. The IC of claim 1, wherein the first body tie comprises:

a first set of one or more parallel fin structures situated over and electrically coupled to the first diffusion region, wherein the first set of one or more parallel fin structures extend longitudinally along a row dimension;

a second set of one or more parallel fin structures situated over and electrically coupled to the second diffusion region, wherein the first set of one or more parallel fin structures extend longitudinally along the row dimension; and a set of one or more metal strips electrically coupling the first set of one or more parallel fin structures to the second set of one or more parallel fin structures, wherein the set of one or more metal strips extend longitudinally along a column dimension, and wherein the set of one or more metal strips are electrically coupled to the first voltage rail.

19. The IC of claim 18, wherein the first body tie comprises a set of polysilicon structures extending longitudinally along the column dimension, wherein the set of one or more metal strips are situated between the set of polysilicon structures, respectively.

20. A wireless communication device, comprising:

at least one antenna;

a transceiver coupled to the at least one antenna; and an integrated circuit (IC) including one or more signal processing cores coupled to the transceiver, wherein the one or more signal processing cores comprises:

a first row of cells including a first set of one or more signal processing complementary metal oxide semiconductor (CMOS) cells including a first diffusion region;

a second row of cells including a second set of one or more signal processing CMOS cells including a second diffusion region; and a first body tie electrically coupling a first voltage rail to the first and second diffusion regions;

wherein the first row of cells includes a third diffusion region, the one or more signal processing cores further comprising a second body tie electrically coupling a second voltage rail to the third diffusion region, wherein the second body tie is substantially aligned with the first body tie in a column dimension.

* * * * *